United States Patent
Inage et al.

(10) Patent No.: US 7,864,555 B2
(45) Date of Patent: Jan. 4, 2011

(54) PRODUCTION METHOD FOR SEMICONDUCTOR STORAGE DEVICE AND SEMICONDUCTOR STORAGE DEVICE

(75) Inventors: Mayumi Inage, Kawasaki (JP); Akio Iwata, Kawasaki (JP); Gaku Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/200,624

(22) Filed: Aug. 28, 2008

(65) Prior Publication Data
US 2009/0003027 A1    Jan. 1, 2009

Related U.S. Application Data

(63) Continuation of application No. PCT/JP2006/303660, filed on Feb. 28, 2006.

(51) Int. Cl.
*G11C 5/02* (2006.01)
*G11C 4/00* (2006.01)
*G11C 5/14* (2006.01)

(52) U.S. Cl. .................. 365/51; 365/63; 365/226; 29/592.1

(58) Field of Classification Search .............. 365/326, 365/63
See application file for complete search history.

(56) References Cited

U.S. PATENT DOCUMENTS

| | | | |
|---|---|---|---|
| 5,995,439 | A | 11/1999 | Watanabe et al. |
| 6,069,834 | A | 5/2000 | Watanabe et al. |
| 6,097,663 | A | 8/2000 | Watanabe et al. |
| 6,246,629 | B1 | 6/2001 | Watanabe et al. |
| 6,335,898 | B2 | 1/2002 | Watanabe et al. |
| 6,609,236 | B2 | 8/2003 | Watanabe et al. |

2001/0005325 A1    6/2001    Kitayama et al.

(Continued)

FOREIGN PATENT DOCUMENTS

JP        5-174578        7/1993

(Continued)

OTHER PUBLICATIONS

International Search Report mailed on May 23, 2006 in connection with International Application No. PCT/JP2006/303660.

(Continued)

*Primary Examiner*—Hoai V Ho
*Assistant Examiner*—James G Norman
(74) *Attorney, Agent, or Firm*—Staas & Halsey LLP

(57) ABSTRACT

A pair of power supply lines that are orthogonal to the border with the cell array are placed, for each one-bit processing circuit of the data processing unit, in a semiconductor storage device such as SRAM or the like comprising a data processing unit for writing data to memory cells and reading it therefrom, a row decode unit for driving the word lines of the memory cells, and a timing control unit for generating a control pulse for the data processing unit, all of which are arranged around the circumference of a cell array in which memory cells are arrayed in a grid-like fashion. MOS transistors are placed between the power supply lines in such a position that the principal axis direction of the gate pattern is orthogonal to the two aforementioned wirings, and are closely arrayed in the longitudinal direction of the power supply lines.

14 Claims, 23 Drawing Sheets

U.S. PATENT DOCUMENTS

| | | |
|---|---|---|
| 2001/0014051 A1 | 8/2001 | Watanabe et al. |
| 2002/0009834 A1 | 1/2002 | Watanabe et al. |
| 2005/0201181 A1* | 9/2005 | Ishikura .................. 365/226 |

FOREIGN PATENT DOCUMENTS

| | | |
|---|---|---|
| JP | 10-50851 | 2/1998 |
| JP | 10-65124 | 3/1998 |
| JP | 2001-168302 | 6/2001 |

OTHER PUBLICATIONS

Extended European Search Report for Application No. 06714797.5-2203; dated Oct. 6, 2010.

* cited by examiner

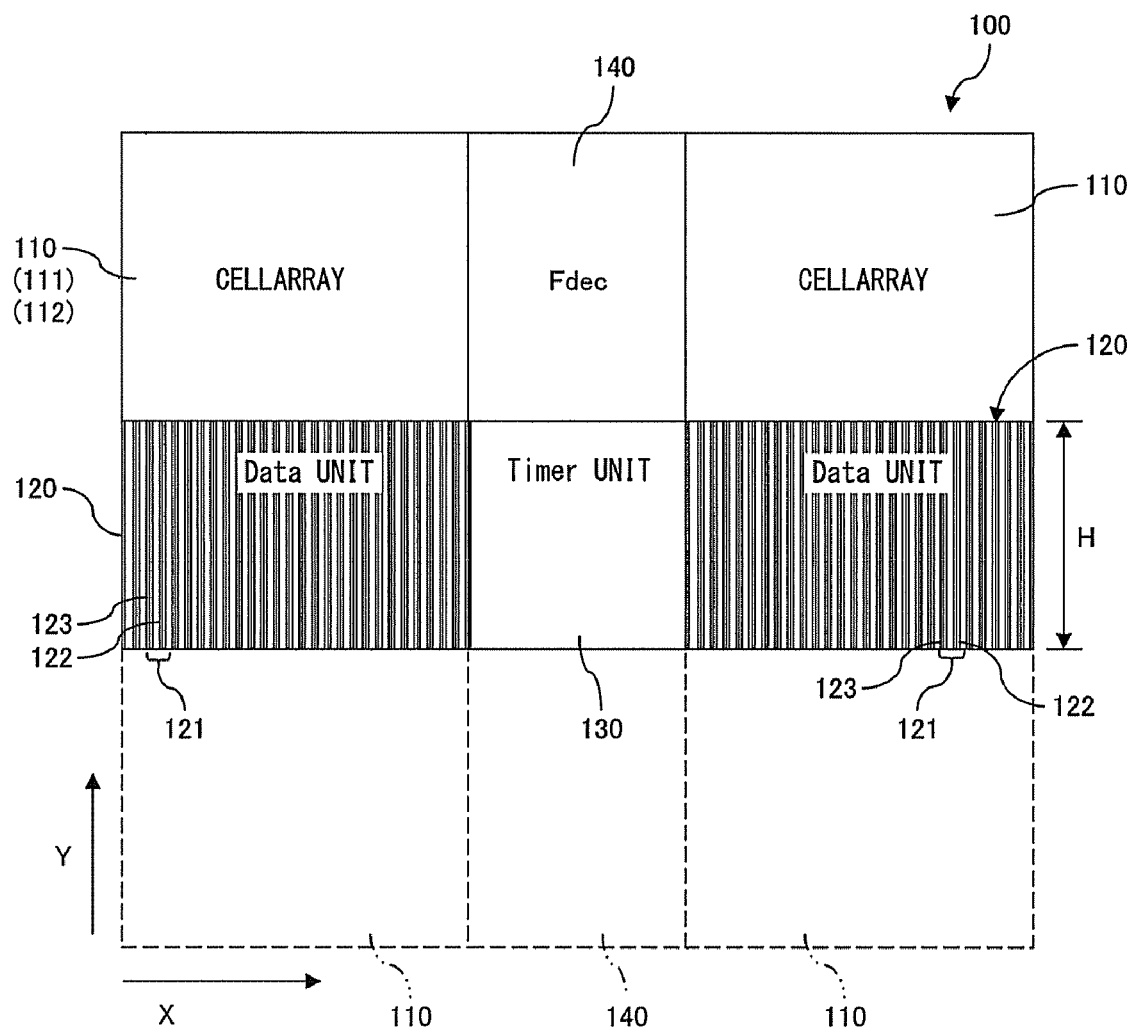
F I G. 3

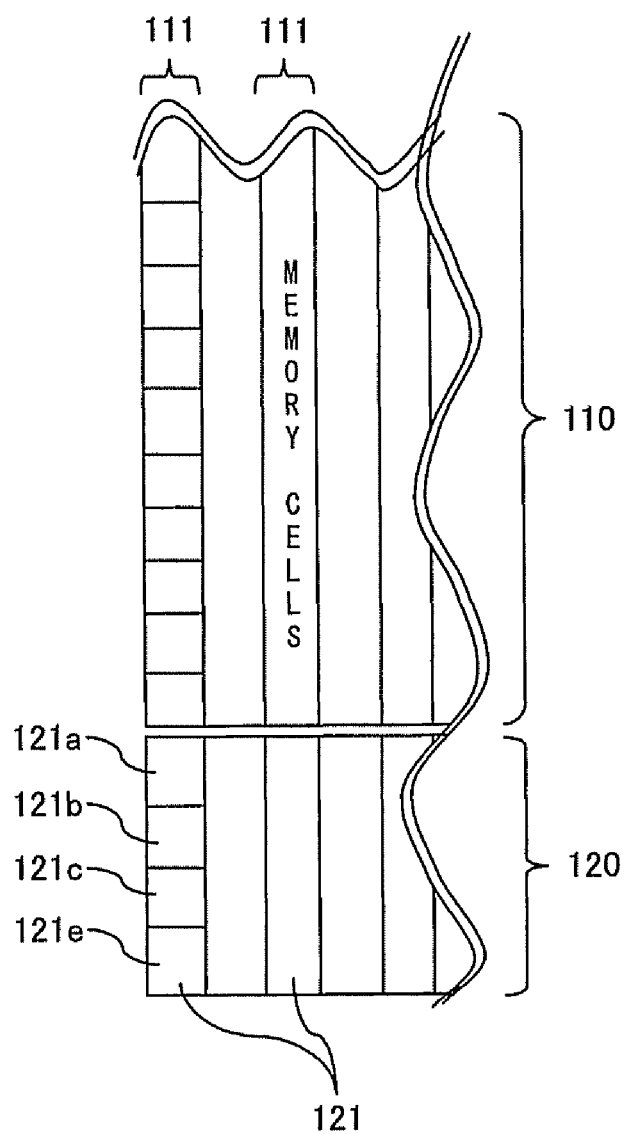
F I G. 5

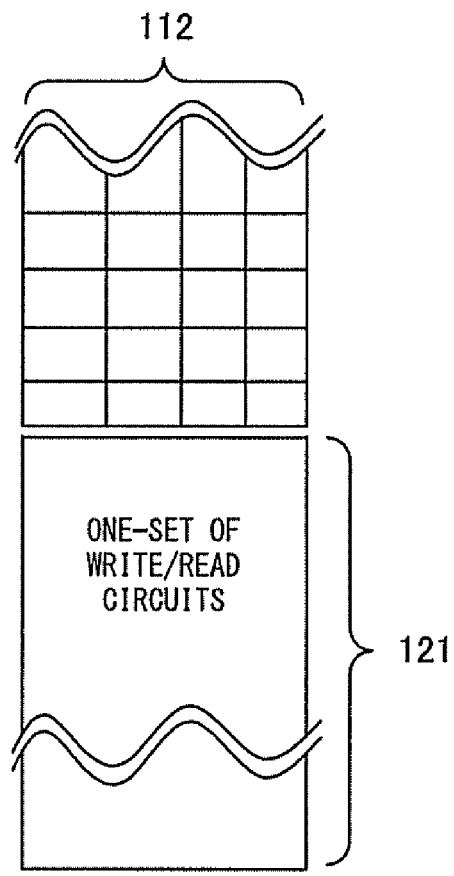
F I G. 6

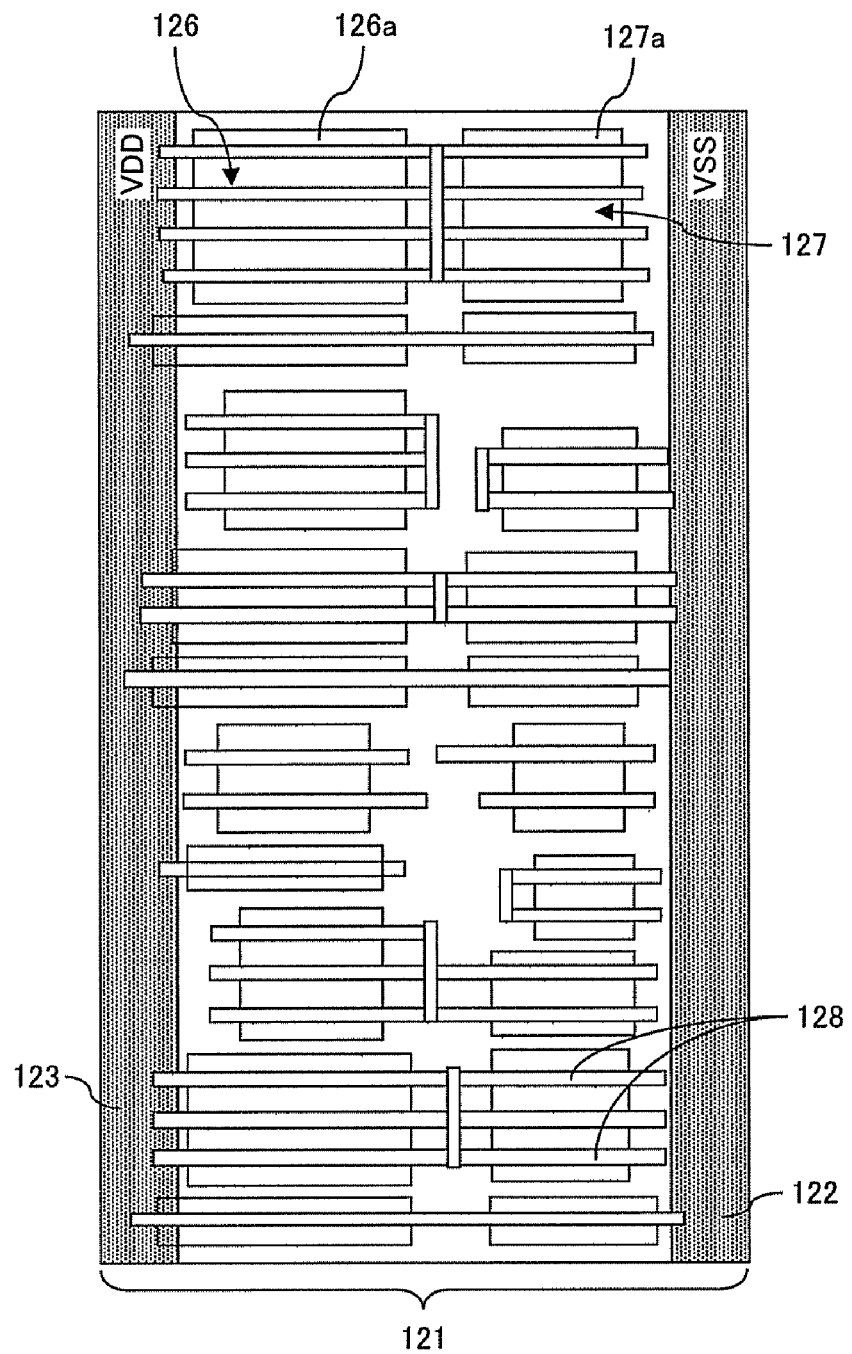
F I G. 9

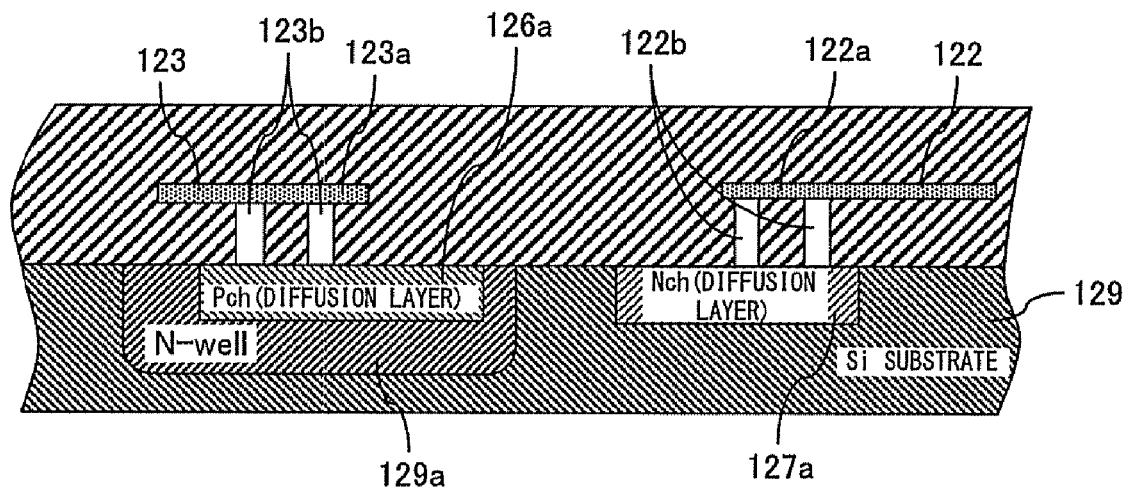
F I G. 1 2

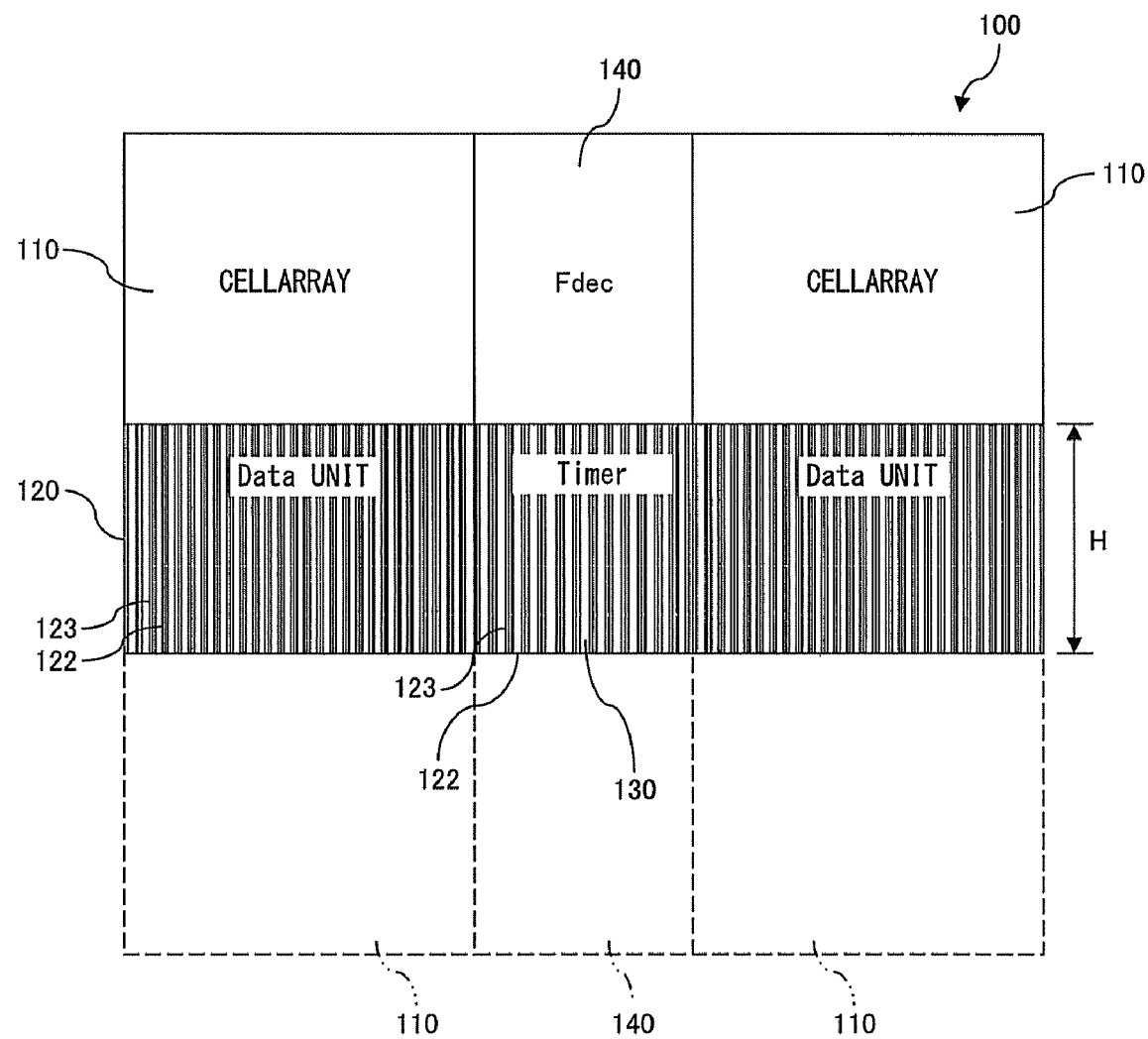
F I G. 1 6

PRODUCTION METHOD FOR SEMICONDUCTOR STORAGE DEVICE AND SEMICONDUCTOR STORAGE DEVICE

CROSS REFERENCE TO RELATED APPLICATION

This application is a continuation application of international PCT application No. PCT/JP2006/303660 filed on Feb. 28, 2006.

BACKGROUND OF THE INVENTION

1. Field of the Invention

The present invention relates to a semiconductor storage device and a production technique therefor, and in particular to a technique effectively applicable to the layout of power lines and the like for, for example, a semiconductor storage device such as static random access memory (SRAM).

2. Description of the Related Art

A one-bit data input/output circuit of, for example, a semiconductor storage device such as SRAM comprises a write/read circuit (i.e., a data unit) for data and a memory cell array for storing the data.

In a simple layout, it is conceivable to array memory cells in a 1-bit single array as in a semiconductor storage device according to the reference technique shown in FIG. 1A. For a product such as an application-specific integration circuit (ASIC), when considering both simplicity of use in the case of packaging it as a circuit macro for a semiconductor storage device and access performance, the memory cells are divided into four columns (i.e., a 4-column configuration) or eight columns (i.e., an 8-column configuration) as shown in FIG. 1B, and the memory cells are commonly used by equipping a column selection circuit corresponding to the plural-column structure.

Physically, the layout consists of a corresponding single set of write and read circuits placed on the upper or lower side of the memory cells which are divided into four columns (4-column) or eight columns (8-column) in the horizontal direction as shown in FIG. 1B.

The unit structure shown in FIG. 1A or FIG. 1B is arrayed for the number of required bits in the horizontal direction as shown in FIG. 1C. The left side of FIG. 1C shows the configuration of arraying the single set of circuits shown in FIG. 1A in a repeating pattern in the width direction, while the right side shows the configuration of arraying the single set of circuits shown in FIG. 1B in a repeating pattern in the width direction.

In addition to the data unit and memory cell array unit shown in FIG. 1C, the physical structure of the entire SRAM further includes a timer unit for generating a timing pulse to be supplied to each part of the SRAM, and a decode unit (Fdec unit) for driving word lines as shown in FIG. 1D.

Incidentally, while the overall structure shown in FIG. 1D shows the configuration of arraying a cell array on one side of the data unit, it is also possible to place the cell array symmetrically on the upper and lower sides, sandwiching the zone of the data unit. In such a case, the data unit will be equipped with a selection circuit for selecting either of the cell arrays on the upper and lower sides.

One bit of the data unit comprises a data input latch, a data output latch, an upper/lower selection circuit, a redundancy selection circuit, a column selection circuit, and the like as shown in FIG. 1C. In the actual layout, the individual circuits, by function, are packaged in a vertically oblong layout area.

On a transistor (Tr) level such as CMOS, the principal axis direction of a gate pattern (PC) constituted by polycrystal silicon or the like is the Y direction (i.e., the height direction of one-bit memory cells) as shown in FIGS. 1E and 1F, the power supply uses the X direction (i.e., the width direction of one-bit memory cells), the power supply line VDD is connected to a P channel (P-ch), and the power supply line VSS is connected to an N channel (N-ch).

Focusing on the packaging characteristics, the SRAM is laid out in a vertically oblong configuration in which a plurality of transistors (Tr), each of which is formed by setting the principal axis direction of the gate pattern in the vertical (Y) direction, are finely integrated in the Y direction as shown in layout areas L1 through L4 of FIG. 1E.

The structure of the semiconductor storage device according to the reference technique described above is faced with several technical problems as follows:

(1). For packaging transistors (Tr) by function in the vertically oblong layout area such as that shown in FIG. 2A, the number of power supply lines such as VDD and VSS is increased, suppressing the area around which a signal wiring can be drawn in the X (horizontal) direction as shown in FIG. 2B and increasing the limit of the drawing path of the signal lines.

(2). When a countermeasure is adopted for securing the area of signal wiring drawn around in the X (horizontal) direction so as to reduce the thickness of the power supply lines, as shown in the layout area L11 of FIG. 2A, the permissible power supply current is reduced and the power supply strength is accordingly reduced.

(3). Because a vertically oblong area is divided by a large number of power supply lines placed in the X direction to lay out transistors, extraneous areas are generated in the X direction as shown in the layout area L12 of FIG. 2A. Further, the share of power supply lines in the wiring layer in which the present power supply line exists is large and therefore the internal wiring of each circuit group needs to be placed in a layer of wiring as much lower than the wiring layer in which the power supply line exists as possible, as shown in the layout area L13 of FIG. 2A. Securing the drawing area L14 for the internal wiring as shown in FIG. 2B further reduces the packaging density of the transistors (Tr).

(4). If the direction of the power supply line is matched with the data unit as a result of giving a higher priority to the consistency of a layout in the timer unit placed at the center of the data unit as shown in FIG. 2C, a layout form different from that of the data unit in the layout area L21 of FIG. 2C is adopted and thereby layout efficiency is reduced.

Note that Laid-Open Japanese Patent Application Publication No. H10-65124 has disclosed a technique for commonizing a memory core, a basic logic gate, and the layout pattern of a transfer circuit with another product group in a semiconductor integrated circuit formed on a semiconductor chip by combining a memory core, basic logic gate, and transfer circuit capable of changing over the transfer pattern of data in real time.

While the technique according to this reference makes it possible to shorten the design time of various circuit products combining the memory core, basic logic gate and transfer circuit, none of the technical problems of the above described paragraphs (1) through (4), which are assigned to the present invention, are recognized.

Meanwhile, Laid-Open Japanese Patent Application Publication No. H10-50851 has disclosed a layout method comprising arraying cells in accordance with the logic of the target, each cell having no power supply line traversing within the circuit cell, possessing a minimum power supply terminal definition, and possessing a terminal definition including grid points of mutually different horizontal and vertical wiring tracks, and then carrying out power supply wiring by using a wiring layer corresponding to the principal axis of the wiring of the cell column.

Also, in the case of this reference, however, none of the technical problems of the above described paragraphs (1) through (4) is recognized.

SUMMARY OF THE INVENTION

One aspect of the present invention provides a production method for a semiconductor storage device comprising the processes for: placing, next to each other, a memory cell unit arraying memory cells storing data and a peripheral circuit unit controlling the memory cells; placing, in a manner so as to be orthogonal to the border between the memory cell and corresponding data processing unit, a power supply line within a data processing unit which comprises the peripheral circuit unit and processes the data read from, and written to, the memory cell.

Another aspect of the present invention provides a semiconductor storage device which comprises a memory cell unit arraying memory cells storing data and a peripheral circuit unit controlling the memory cells, wherein a power supply line within a data processing unit which comprises the peripheral circuit unit and processes the data read from, and written to, the memory cell is placed in a manner so as to be orthogonal to the border between the memory cell and corresponding data processing unit.

Furthermore, another aspect of the present invention provides a semiconductor storage device wherein the power supply line of a first peripheral circuit is orthogonal to the border between a one-bit wide memory cell area and the first peripheral circuit within the packaging area of the memory cell area and the first peripheral circuit placed corresponding to the memory cell area.

BRIEF DESCRIPTION OF THE DRAWINGS

The present invention will be more apparent from the following detailed description when the accompanying drawings are referenced.

FIG. 3 is a conceptual diagram exemplifying the configuration of a semiconductor storage device according to a preferred embodiment of the present invention;

FIG. 5 is a conceptual diagram showing a partial extraction of the layout of a one-bit memory cell folded up into a plurality of columns and the peripheral circuit therefor of a semiconductor storage device according to a preferred embodiment of the present invention;

FIG. 6 is a conceptual diagram showing the repeating array of the layout exemplified in FIG. 4;

FIG. 9 is a conceptual diagram exemplifying the placement of the transistors in the layout exemplified in FIG. 8;

FIG. 12 is an outline cross-sectional diagram of the part indicated by the line XII-XII shown in FIG. 10;

FIG. 16 is a conceptual diagram showing a modified embodiment of the layout of a power supply line in a semiconductor storage device according to a preferred embodiment of the present invention.

DESCRIPTION OF THE PREFERRED EMBODIMENTS

Figure 1A:
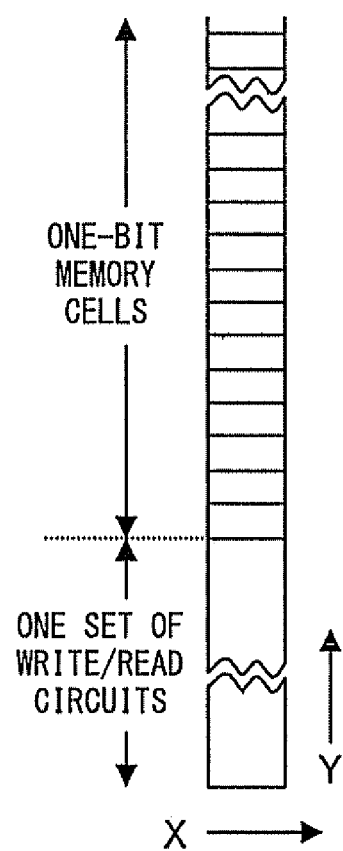
FIG. 1A is a conceptual diagram showing an extraction of an array structure of one column of a one-bit memory cell of a semiconductor storage device according to the reference technique of the present invention.
Figure 1B:
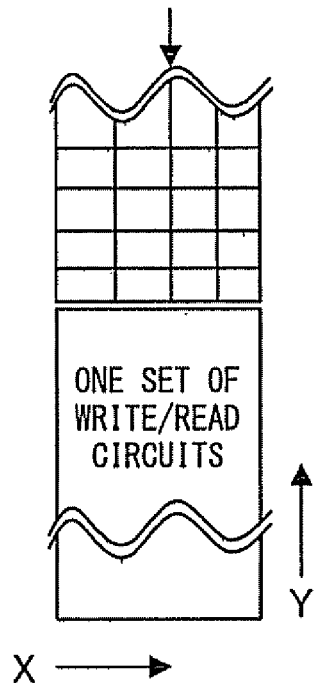
FIG. 1B is a conceptual diagram showing an extraction of an array structure in the case of folding up a one-bit memory cell into a plurality of columns in a semiconductor storage device according to the reference technique of the present invention.
Figure 1C:
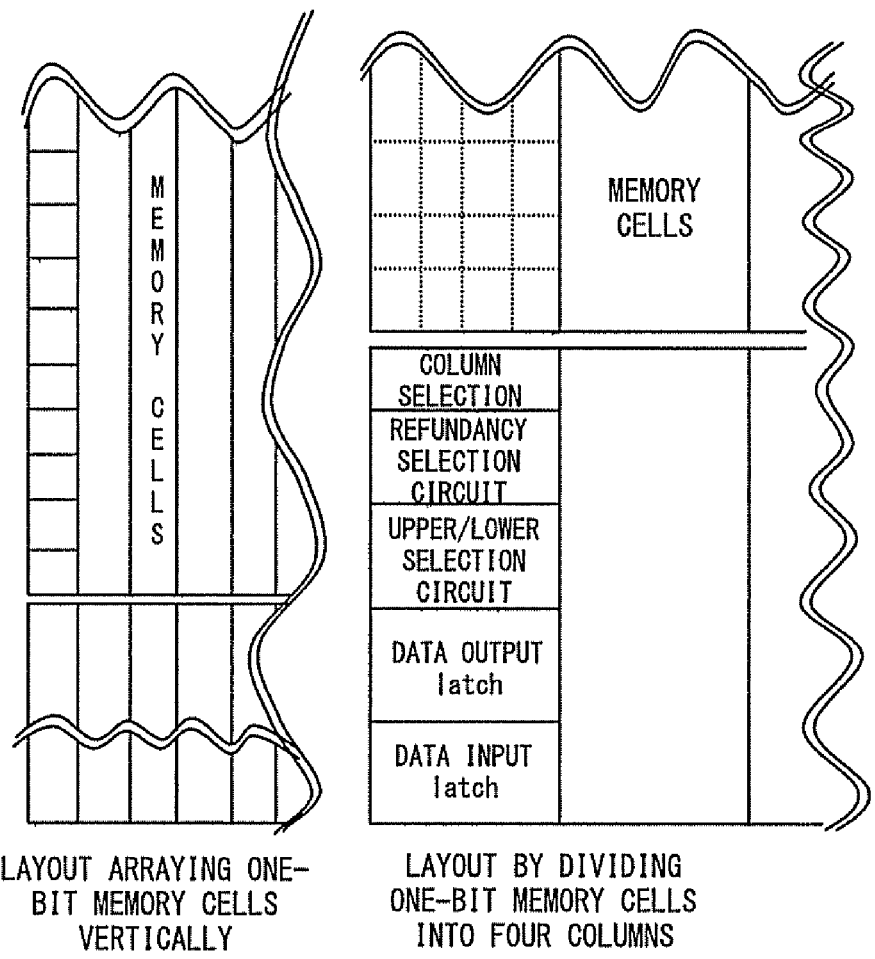
FIG. 1C is a conceptual diagram showing a part of the configuration of SRAM by placing the array structure of FIG. 1A or FIG. 1B in a repeating pattern.
Figure 1D:
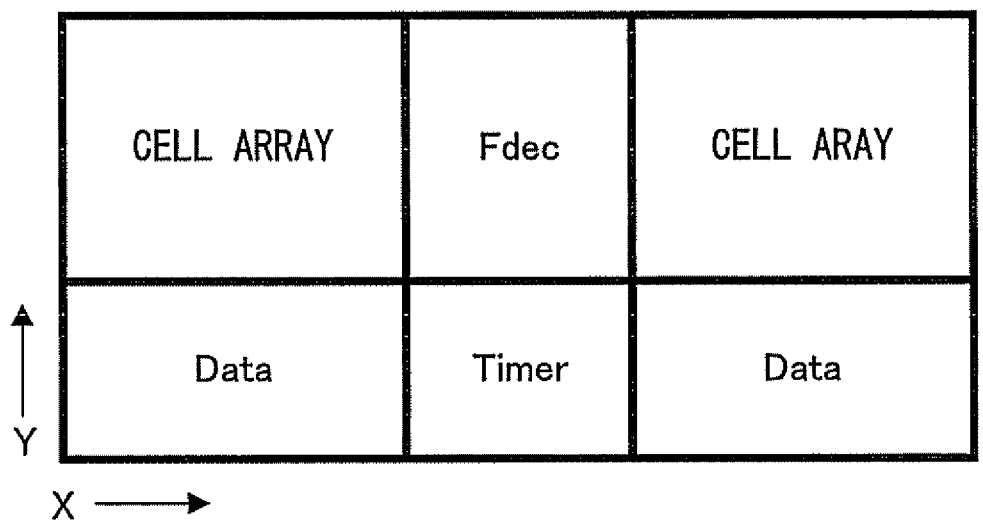
FIG. 1D is a conceptual diagram showing the overall configuration of the SRAM shown in FIG. 1C.
Figure 1E:
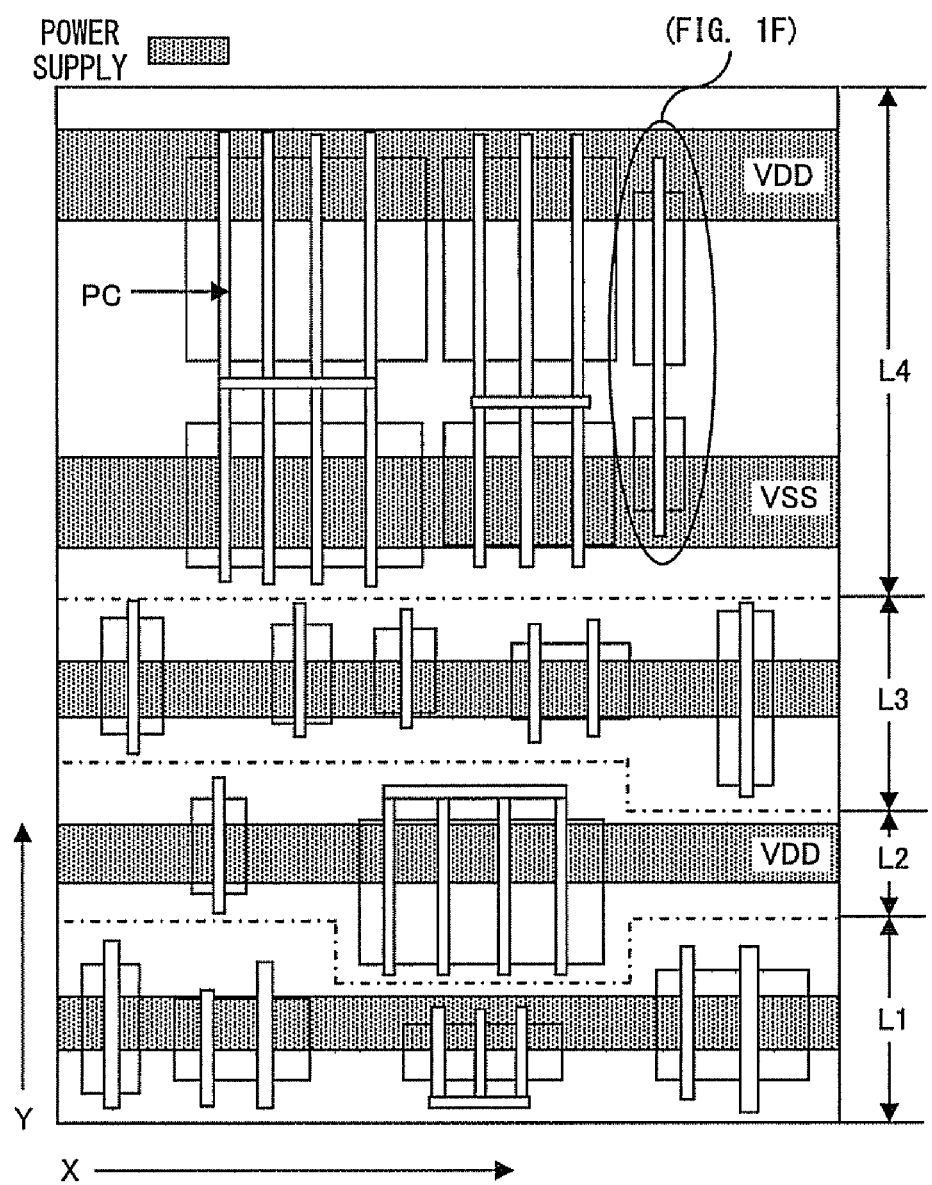
FIG. 1E is a conceptual diagram showing the circuit structure of a data unit of a semiconductor storage device according to the reference technique of the present invention.
Figure 1F:
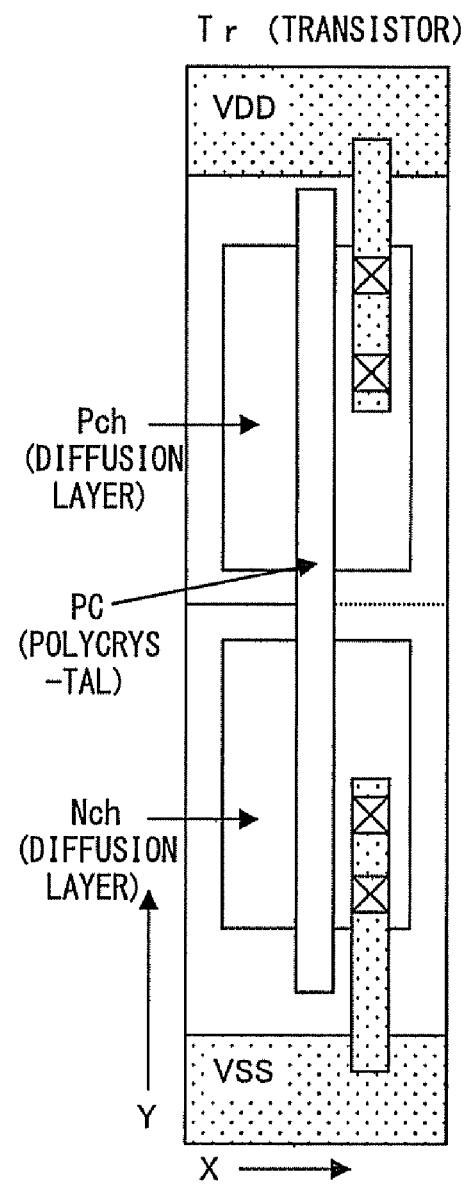
FIG. 1F is a conceptual diagram showing the placement of a transistor in the circuit structure of a data unit of a semiconductor storage device according to the reference technique of the present invention.
Figure 2A:
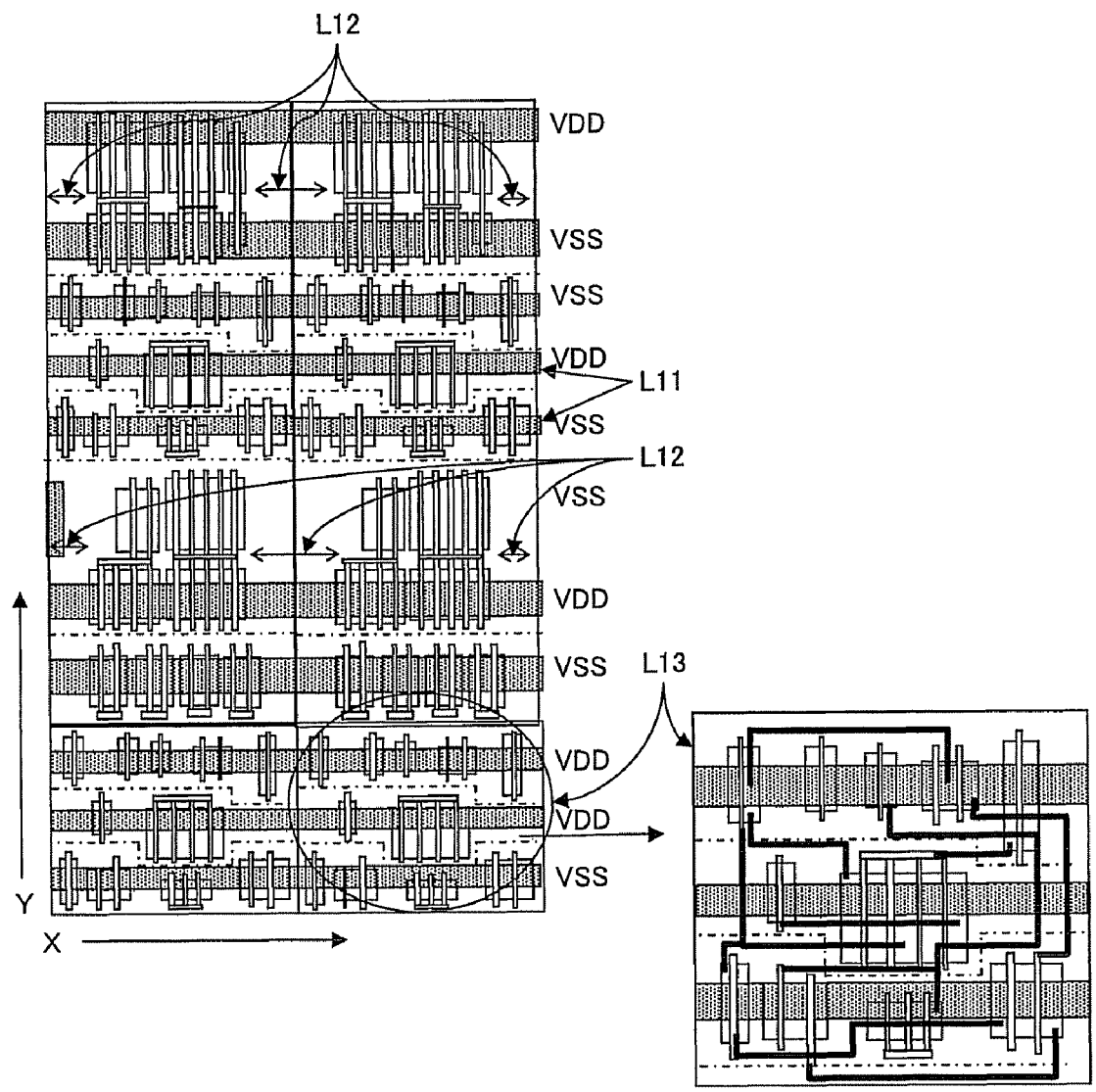
FIG. 2A is a conceptual diagram describing the technical problem related to the power supply line and the like of a semiconductor storage device according to the reference technique of the present invention.
Figure 2B:
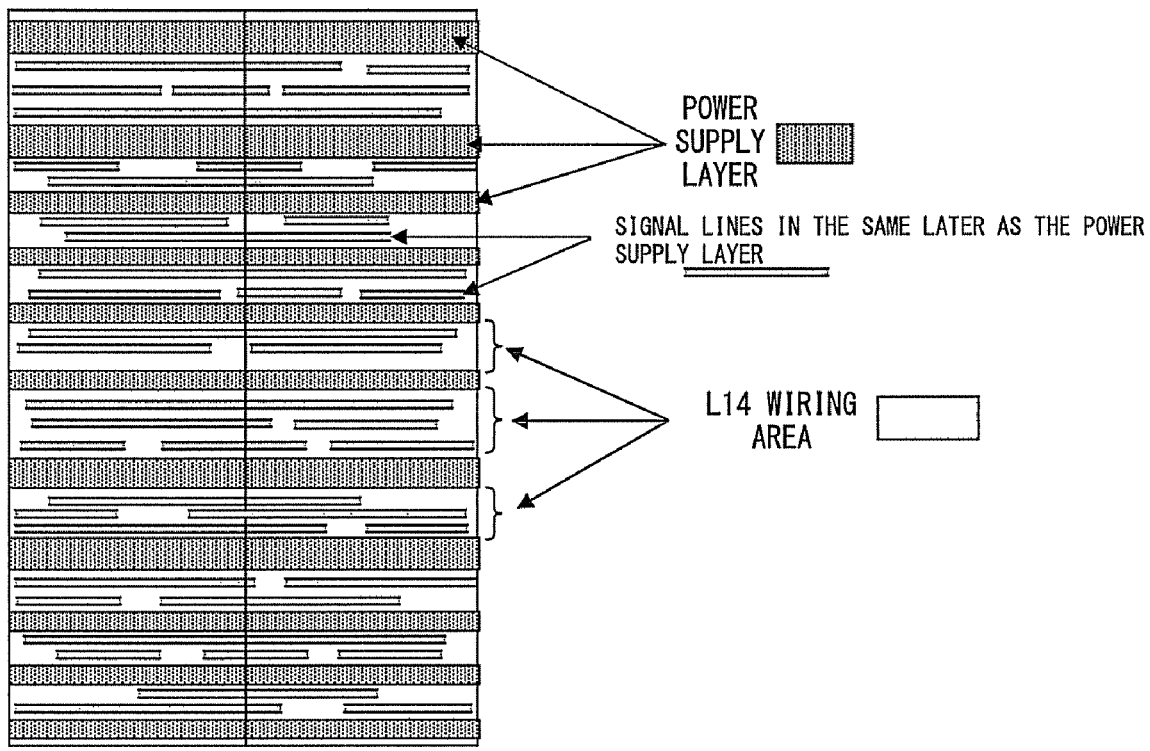
FIG. 2B is a conceptual diagram describing the technical problem related to the power supply line and the like of a semiconductor storage device according to the reference technique of the present invention.
Figure 2C:
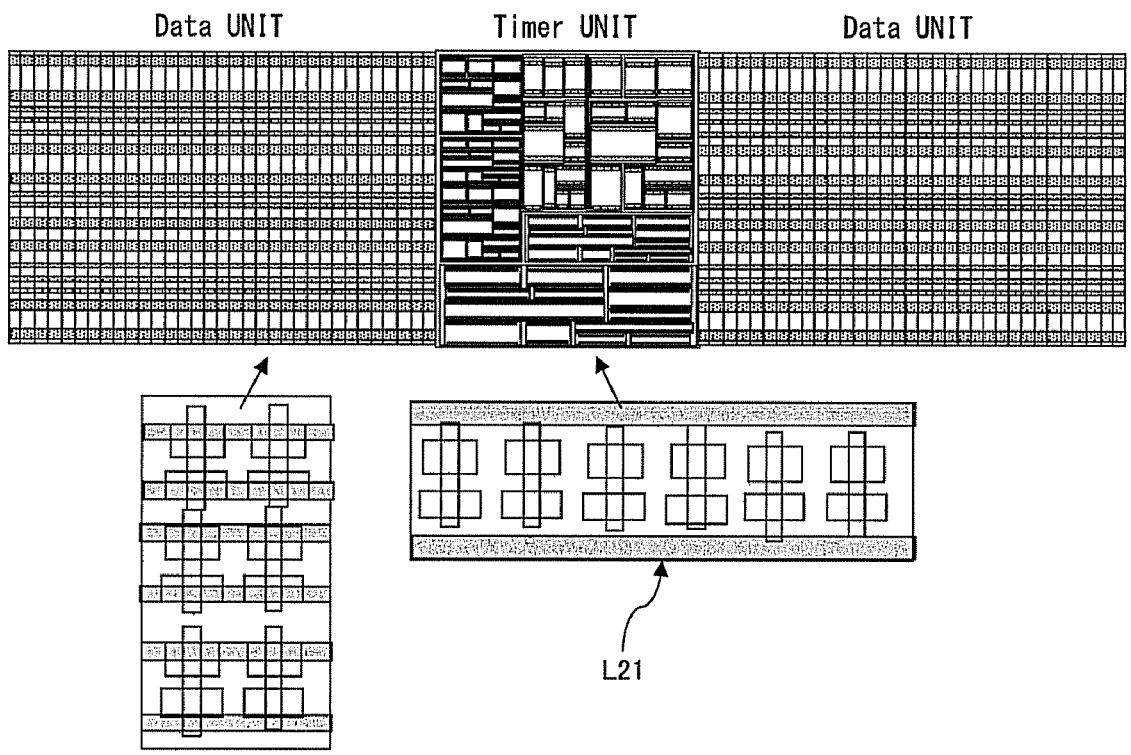
FIG. 2C is a conceptual diagram describing the technical problem related to the power supply line and the like of a semiconductor storage device according to the reference technique of the present invention.

The following is a description, in detail, of the preferred embodiment of the present invention by referring to the accompanying drawings.

FIG. 3 is a conceptual diagram exemplifying the configuration of a semiconductor storage device produced by the production method for a semiconductor storage device according to a preferred embodiment of the present invention.

Note that the following description is provided by defining, as appropriate, the left-right direction of FIG. 3 as the X direction and the up-down direction as the Y direction.

The semiconductor storage device 100 according to the present embodiment comprises a cell array 110, a data processing unit (data unit) 120 (i.e., a first peripheral circuit), a timing control unit (timer unit) 130 (i.e., a second peripheral circuit), and a row decode unit (Fdec) 140.

The data processing unit 120 is placed adjacent to one side of the rectangular cell array 110, and the row decode unit 140 is placed adjacent to another side which is orthogonal to the first-mentioned side.

Further, the timing control unit 130 is placed so as to be adjacent to the data processing unit 120 and row decode unit 140.

In the configuration of FIG. 3, the cell array 110 and data processing unit 120 are placed in pairs horizontally and symmetrically by sandwiching the row decode unit 140 and timing control unit 130, respectively.

That is, the row decode unit 140 and timing control unit 130 are provided commonly for two of the cell arrays 110 and data processing units 120.

Note that the cell array can be further placed under the data processing unit 120 on an as-required basis, as exemplified by the dotted lines in FIG. 3, so as to sandwich the data processing unit 120 from the top and bottom. In this case, one data processing unit 120 is commonly used for a pair of cell arrays 110 placed on the top and bottom thereof.

The cell array 110 comprises a plurality of memory cells, which are for storing data in units of bit, that are fundamentally arrayed in a grid-like pattern.

The row decode unit 140 drives word lines (not shown in a drawing herein) for selecting one row of memory cells in the X direction (i.e., the row direction) of the cell array 110 in accordance with externally given address information.

The data processing unit 120 comprises a plurality of one-bit processing circuits 121 and the like for writing data to and reading it from the row (or rows) of memory cells selected by the row decode unit 140 in the Y direction (i.e., the column direction) of the cell array 110 as described later.

The timing control unit 130 generates a control signal, such as a timing pulse, for driving the data processing unit 120 and row decode unit 140.

Figure 4:
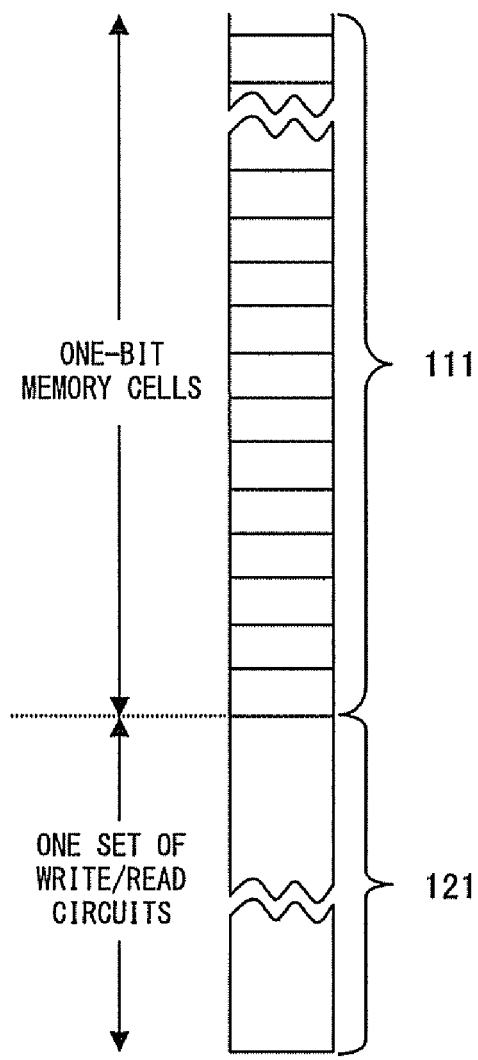
FIG. 4 is a conceptual diagram showing a partial extraction of the layout of one column of a one-bit memory cell and the peripheral circuit therefor of a semiconductor storage device according to a preferred embodiment of the present invention.

As exemplified in FIG. 4, the cell array 110 is equipped with a one-bit processing unit 121 for each column in the case of a configuration arraying a column of one-bit memory cells 111 in the Y direction.

The placement of the one-bit memory cells 111 and one-bit processing unit 121 in pairs in a repeating pattern in the width direction as exemplified in FIG. 5 constitutes the cell array 110 and data processing unit 120.

Note that multi-column one-bit memory cells 112 in which the one-bit memory cells are folded into a plurality of columns can also be used as the configuration of the memory cells for the cell array 110 as exemplified in FIG. 6.

Also in this case, a one-bit processing circuit 121 is equipped for each of the folded multi-column one-bit memory cells 112.

Figure 7:
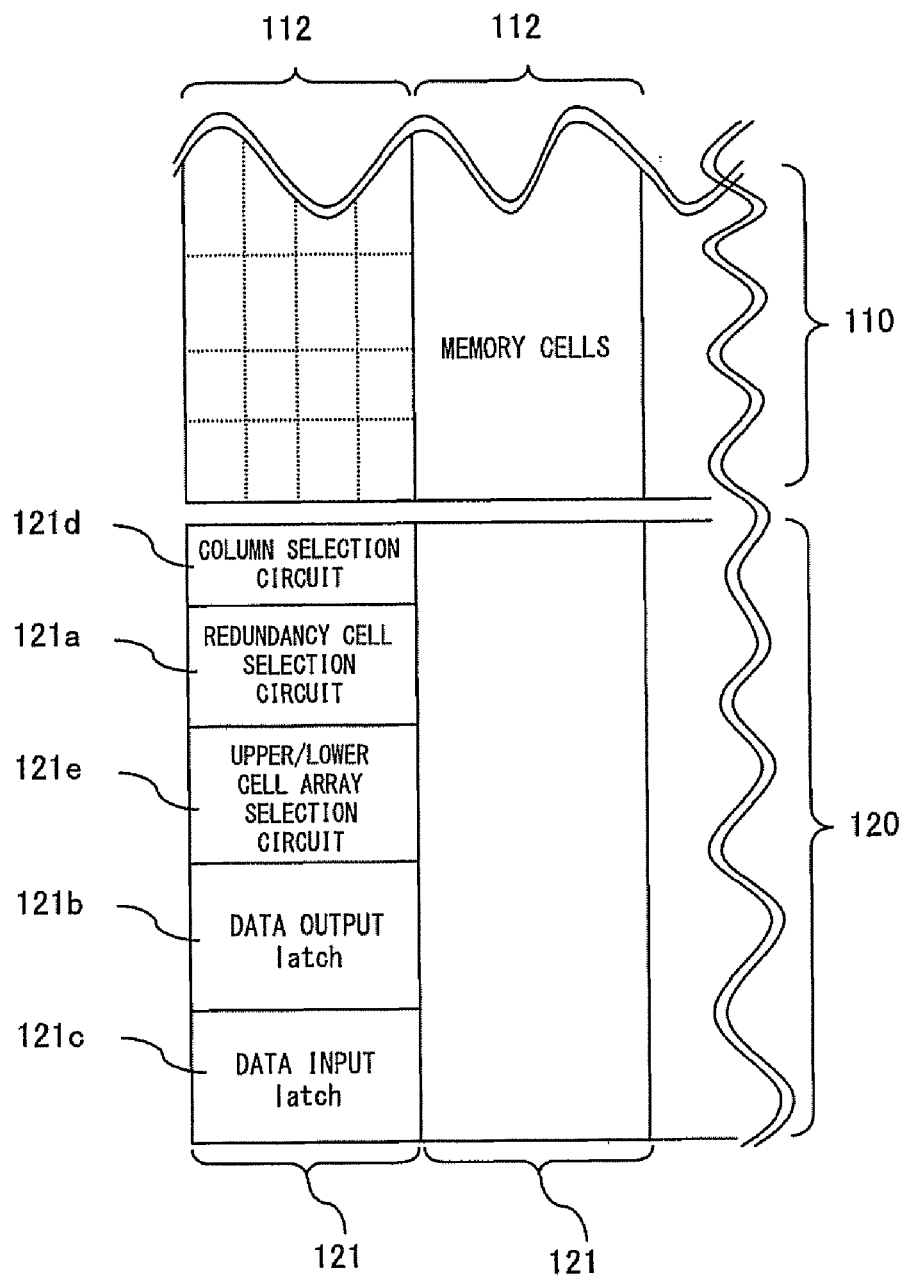
FIG. 7 is a conceptual diagram showing the repeating array of the layout exemplified in FIG. 5.

Then, the placement of the multi-column one-bit memory cells 112 and one-bit processing circuit 121 in a repeating pattern in pairs in the width direction (i.e., the X direction) constitutes the cell array 110 and data processing unit 120 as exemplified in FIG. 7.

The semiconductor storage device 100 according to the present embodiment is, as an example, SRAM, and the memory cell retains one-bit data by means of a flip-flop without requiring a storage retaining operation.

When equipping a single one-bit processing circuit 121 corresponding to one column of the one-bit memory cells 111, the individual one-bit processing circuit 121 constituting the data processing unit 120 comprises a redundancy cell selection circuit 121a, a data output latch 121b, a data input latch 121c, and, on an as-required basis, an upper/lower cell array selection circuit 121e, as exemplified in FIG. 5.

The redundancy cell selection circuit 121a implements the function of accessing, on an as-required basis, a redundant cell used for a faulty bit relief equipped in the one-bit memory cells 111.

The data output latch 121b temporarily retains bit data read from the one-bit memory cells 111.

The data input latch 121c temporarily retains bit data to be written to the one-bit memory cells 111.

In the case of placing the cell arrays 110 on the upper and lower sides of, and sandwiching, the data processing unit 120 as shown by the dotted lines in the above described FIG. 3, the upper/lower cell array selection circuit 121e selects either of the one-bit memory cells 111 on the upper and lower sides to be accessed.

Further, in the case of equipping the one-bit processing circuit 121 corresponding to the folded multi-column one-bit memory cells 112 as exemplified in FIG. 6, the one-bit processing circuit 121 further comprises a column selection circuit 121d as exemplified in FIG. 7.

The column selection circuit 121d selects any one of a plurality of columns.

Figure 8:
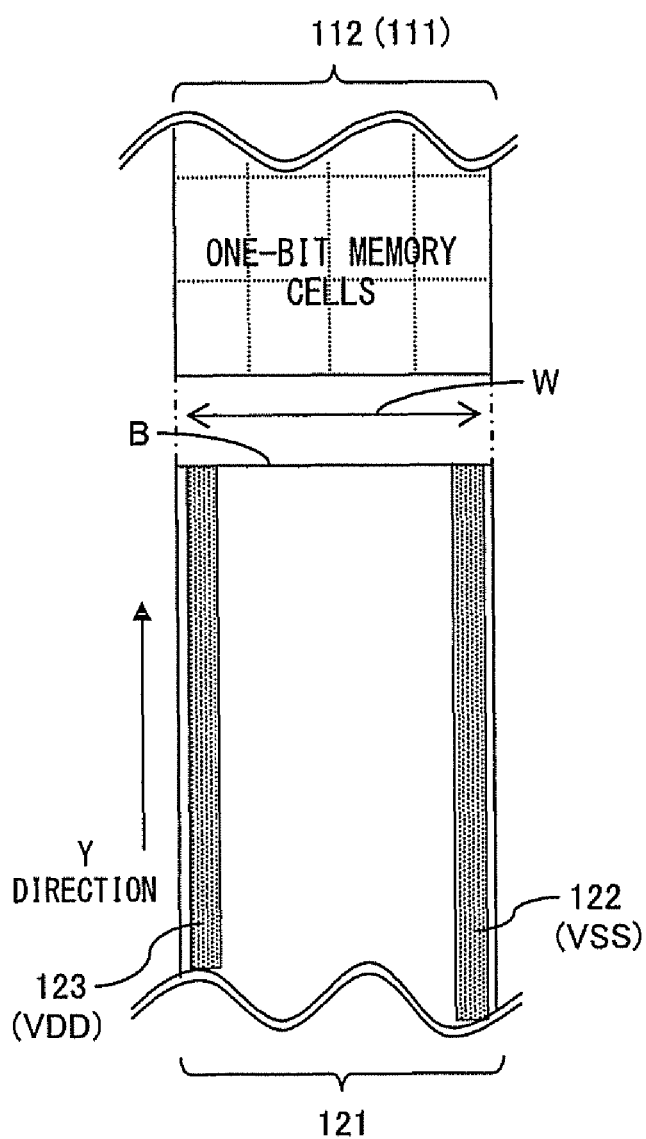
FIG. 8 is a conceptual diagram exemplifying the placement of the power supply lines in the layout exemplified in FIG. 6.

As exemplified in FIG. 8, the present embodiment is configured to place, regularly and parallelly so as to be orthogonal to the border line B between the data processing unit 120 and multi-column one-bit memory cells 112 (i.e., the cell array 110), a pair of power supply lines 122 and 123 for supplying the circuits of the individual one-bit processing circuit 121, including the above described redundancy cell selection circuit 121a through upper/lower cell array selection circuit 121e and the like, with operating power.

This configuration makes it possible to decrease the placement area size of the power supply lines 122 and 123 to be smaller than the conventional case of placing the power supply lines 122 and 123 at random, enabling the utilization of the decreased area for the signal wiring for the one-bit processing circuit 121.

In other words, the freedom in the placement and drawing of the signal wiring is improved without being suppressed by the power supply lines 122 and 123.

Further, a designation of the width of the power supply lines 122 and 123 in accordance with the power consumption of the transistors and the like constituting the one-bit processing circuit 121 makes it possible to guarantee the power capacity (i.e., the power supply strength) supplied through the present power supply lines 122 and 123.

Further, the power supply lines 122 and 123 can be placed regularly in the data processing unit 120 (i.e., the one-bit processing circuit 121) and therefore it is possible to design a power supply line having a large supply power capacity using a smaller number of man-hours in design.

Further, the placement of the power supply lines 122 and 123 and of transistors regularly makes it possible to expect an improvement in the yield of the semiconductor storage device 100 in the production process.

FIG. 8 exemplifies the case of the multi-column one-bit memory cells 112; the configuration will be similar for the one-column one-bit memory cells 111.

If the circuit constituting the one-bit processing circuit 121 is a MOS transistor, the power supply line 122 on one side is used as the VSS, and the power supply line 123 on the other is used as the VDD.

The one-bit processing circuit 121 is placed so that its width matches the placement width W of the corresponding multi-column one-bit memory cells 112 (or the one-bit memory cells 111).

The above described power supply lines 122 and 123 are respectively placed at positions approximately aligned with both end parts of the placement width W.

Further, the MOS transistors constituting the above described circuits, that is, the redundancy cell selection circuit 121a through upper/lower cell array selection circuit 121e, are placed so that the longitudinal directions of their gate patterns are orthogonal to the power supply lines 122 and 123 and, further, are placed in a repeating pattern in the longitudinal direction of the power supply lines 122 and 123 (i.e., the Y direction), as exemplified in FIG. 9.

Figure 10:
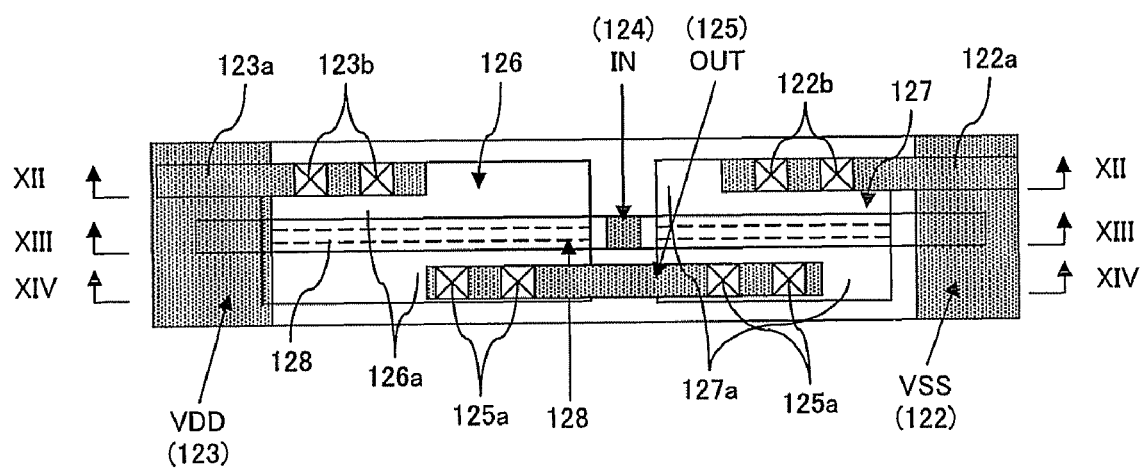
FIG. 10 is a conceptual diagram exemplifying the configuration of the transistor circuit in the layout exemplified in FIG. 8.
Figure 11:
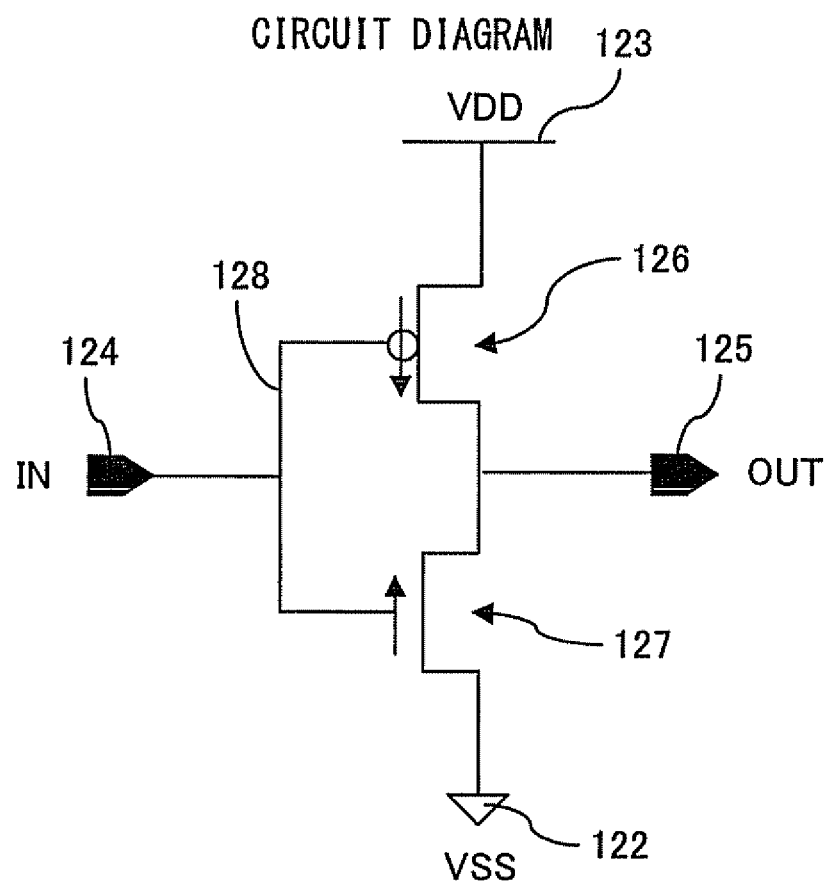
FIG. 11 is a circuit diagram of the transistor circuit exemplified in FIG. 10.

FIG. 10 is a plain view diagram exemplifying an inverter constituted by CMOS transistors as the circuit elements constituting the one-bit processing circuit 121. FIG. 11 is the circuit diagram of the inverter exemplified in FIG. 10.

Figure 13:
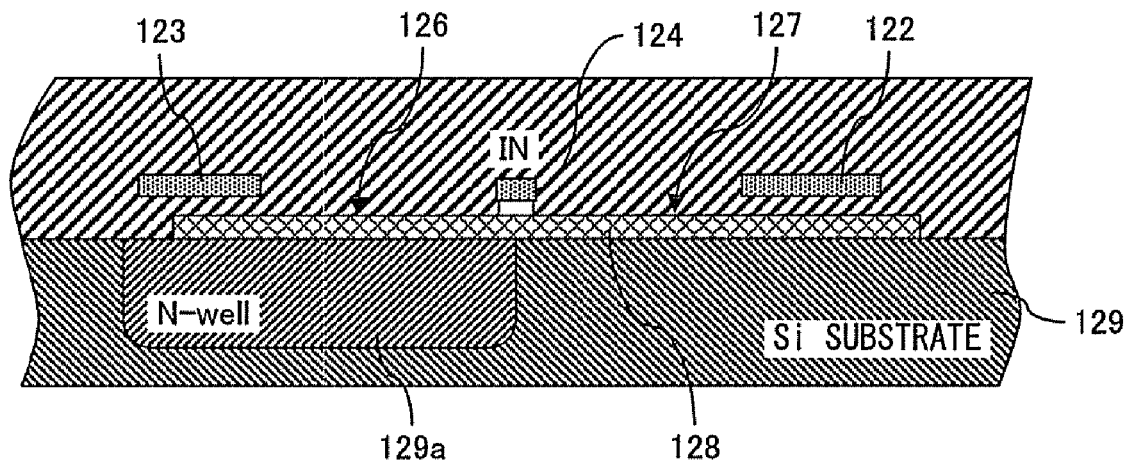
FIG. 13 is an outline cross-sectional diagram of the part indicated by the line XIII-XIII shown in FIG. 10.
Figure 14:
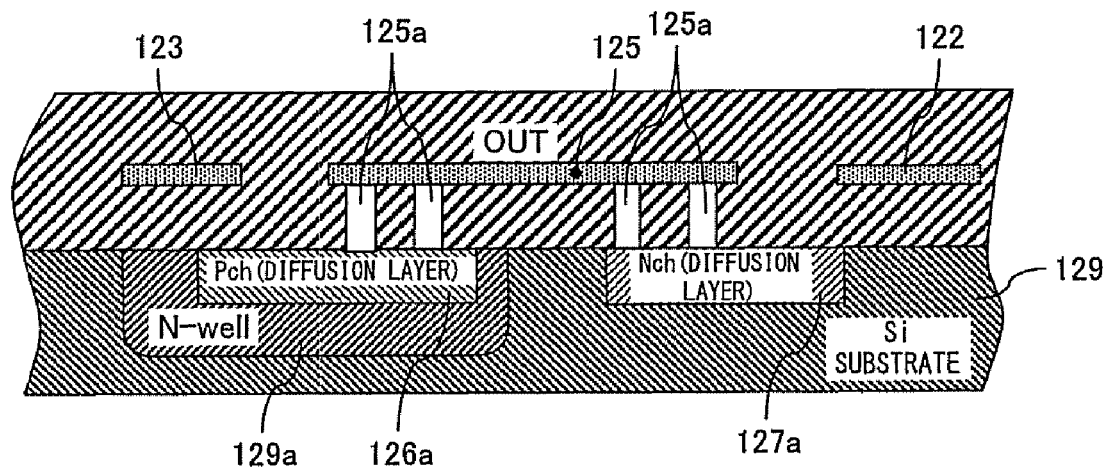
FIG. 14 is an outline cross-sectional diagram of the part indicated by the line XIV-XIV shown in FIG. 10.

Further, FIGS. 12, 13, and 14 are outline cross-sectional diagrams of the parts indicated by the lines XII-XII, XIII-XIII and XIV-XIV, respectively, shown in FIG. 10.

The inverter exemplified in FIG. 10 is configured to connect a p-channel MOS ("pMOS" hereinafter) transistor 126 and an n-channel MOS ("nMOS" hereinafter) transistor 127 serially between the power supply lines 122 and 123, to connect an input signal line 124 to the gate pattern 128 common to both of the transistors 126 and 127, and to extract an output signal line 125 from therebetween.

The pMOS transistor 126 comprises two p-channel diffusion layers 126a placed, in the Y direction, within an n-well 129a formed of a p-type silicon substrate 129, and comprises a gate pattern 128 placed, by way of an insulation film (not shown in a drawing herein), so as to cover the surface of the n-well 129a which protrudes between the two p-channel diffusion layers 126a.

The nMOS transistor 127 comprises two n-channel diffusion layers 127a formed in the Y direction of the silicon substrate 129 and a gate pattern 128 placed, by way of an insulation film, so as to cover the surface of the silicon substrate 129 which protrudes between the two n-channel diffusion layers 127a.

The p-channel diffusion layer 126a on the upper side of the pMOS transistor 126 in the Y direction is connected to the power supply line 123 by way of an embedded contact pattern 123b and power supply terminal pattern 123a.

The n-channel diffusion layer 127a on the upper side of the nMOS transistor 127 in the Y direction is connected to the power supply line 122 by way of an embedded contact pattern 122b and power supply terminal pattern 122a.

The p-channel diffusion layer 126a on the lower side of the pMOS transistor 126 and the n-channel diffusion layer 127a on the lower side of the nMOS transistor 127 are connected together by way of an embedded contact pattern 125a and the output signal line 125.

With this, the inverter as shown in the circuit diagram of FIG. 11 is constituted by the pMOS transistor 126 and nMOS transistor 127, and they are operated mutually inversely by turning On ("1") or Off ("0") a voltage through the input signal line 124 so as to output the low potential ("0") of the power supply line 123, or the high potential ("1") of the power supply line 122, to the output signal line 125.

Figure 15:
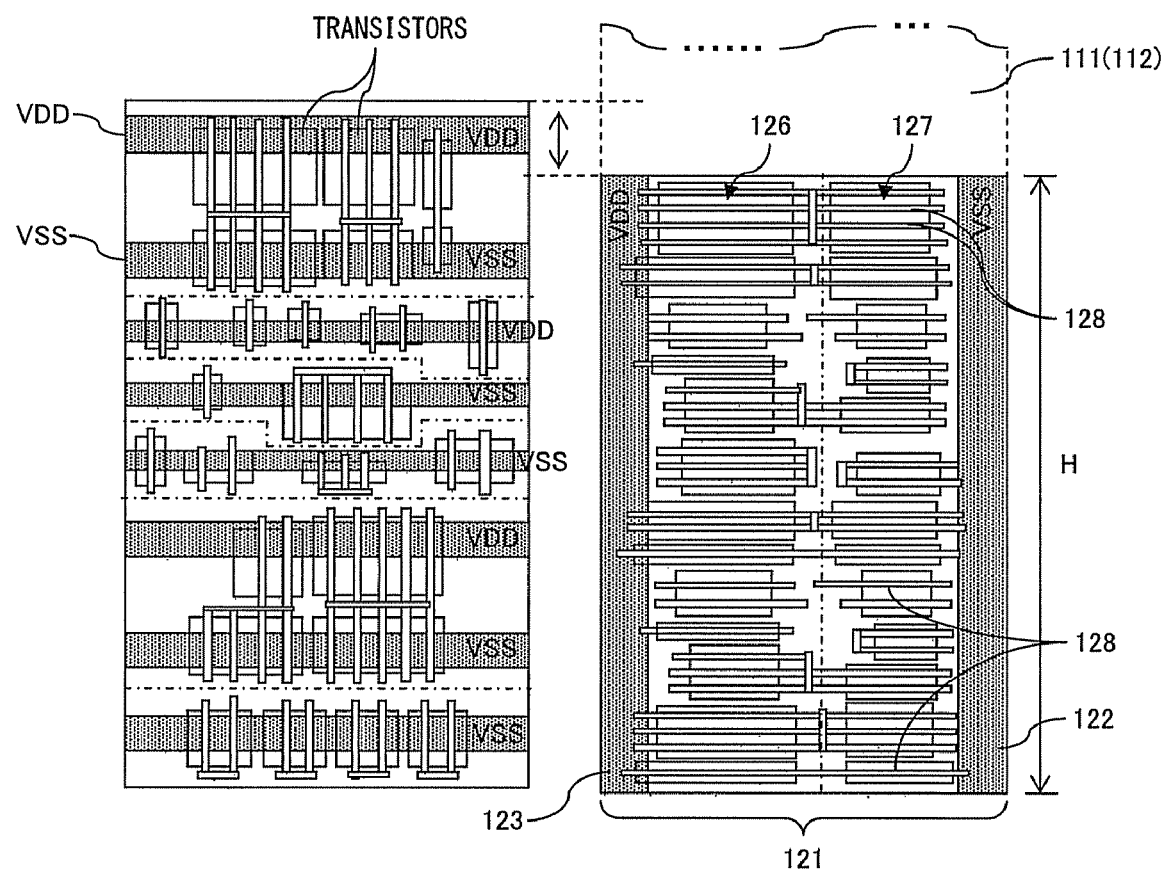
FIG. 15 is a conceptual diagram showing the layout of the power supply line of the peripheral circuit according to the present invention in comparison with the layout of the power supply line of the peripheral circuit according to the technique put forth in the reference technique.

As described above, the present embodiment is configured to place the gate pattern 128 of the transistor so as to be orthogonal to the power supply lines 122 and 123 which are parallelly placed in accordance with the width of the one-bit processing circuit 121, thereby enabling the placement of the transistors constituting the circuit of the one-bit processing circuit 121 in the Y direction at a higher density, as exemplified on the right side of FIG. 15.

Therefore, it is possible to reduce the height H of the one-bit processing circuit 121 (i.e., the data processing unit 120) in the Y direction and to reduce the overall packaging size of the semiconductor storage device 100 in the Y direction.

That is, compared with the case of placing the power supply lines VDD and VSS parallel to the border B between the cell array 110 and data processing unit 120 in the case of the conventional related technique shown on the left side of FIG. 15, the present embodiment, which is shown on the right side of FIG. 15, is configured to place the power supply lines 122 (VSS) and 123 (VDD) in the Y direction and to array the transistors, in each of which the gate pattern 128 is set in the X direction, so as to be accumulated in the Y direction between the power supply lines 122 and 123, thereby making it possible to reduce the size H of the data processing unit 120 in the Y direction.

As a result, it is possible to reduce the packaging area of the entirety of the semiconductor storage device 100 including the data processing unit 120. In other words, when packaging the semiconductor storage device 100 according to the present embodiment in an ASIC or the like, it is possible to improve the degree of freedom in the layout of the ASIC and accomplish the reduction of a chip size.

Note that the regular placement of the power supply lines 122 and 123 for the data processing unit 120 as exemplified in the above described FIG. 8 is also applicable to the timing control unit 130 that is adjacent to the present data processing unit 120, as exemplified in FIG. 16 as a modified embodiment of the present embodiment.

In such a case, a commonized circuit layout for the data processing unit 120 and timing control unit 130 enables a conversion, or the like, of layouts between the data processing unit 120 and timing control unit 130, thereby making it possible to improve the layout efficiency, simplify the circuit design, and increase the production yield.

A first aspect of the above described embodiments provides a production method for a semiconductor storage device comprising the processes for: placing, next to each other, a memory cell unit arraying memory cells storing data and a peripheral circuit unit controlling the memory cells; placing, in a manner so as to be orthogonal to the border between the memory cell and corresponding data processing unit, a power supply line within a data processing unit which comprises the peripheral circuit unit and processes the data read from, and written to, the memory cell.

A second aspect of the above described embodiments provides the production method for a semiconductor storage device according to the first aspect, comprising the process for placing a pair of the power supply lines within the data processing unit so as to correspond to each of both end parts of the placement area of the memory cell that is one bit of the memory cell unit in width.

A third aspect of the above described embodiments provides the production method for a semiconductor storage device according to the first aspect, comprising the process for arraying circuit structures in a repeating pattern in the longitudinal direction of the power supply line, each circuit structure having the gate pattern of a MOS transistor, which is comprised by the data processing unit, placed in a direction orthogonal to the power supply line.

A fourth aspect of the above described embodiments provides the production method for a semiconductor storage device according to the first aspect, wherein the data processing unit comprises, corresponding to each of the one-bit wide memory cells, a redundancy selection circuit, a data output latch, and a data input latch.

A fifth aspect of the above described embodiments provides the production method for a semiconductor storage device according to the first aspect, comprising the process for placing a power supply line for a timer unit which is placed next to the data processing unit within the peripheral circuit unit and which generates a pulse for driving the aforementioned peripheral circuit unit, wherein the present power supply line is placed equivalently to the placement of the power supply line for the data processing unit.

A sixth aspect of the above described embodiments provides the production method for a semiconductor storage device according to the first aspect, wherein the semiconductor storage device is static random access memory (SRAM).

A seventh aspect of the above described embodiments provides a semiconductor storage device which comprises a memory cell unit arraying memory cells storing data and a peripheral circuit unit controlling the memory cells, wherein a power supply line within a data processing unit which comprises the peripheral circuit unit and processes the data read from, and written to, the memory cell is placed in a manner so as to be orthogonal to the border between the memory cell and corresponding data processing unit.

An eighth aspect of the above described embodiments provides the semiconductor storage device according to the seventh aspect, wherein the power supply line within the data processing unit is placed so as to correspond to each of both end parts of the placement area of the memory cell that is one bit of the memory cell unit in width.

A ninth aspect of the above described embodiments provides the semiconductor storage device according to the seventh aspect, wherein circuit structures each placing the gate pattern of a MOS transistor in a direction orthogonal to the power supply line, the MOS transistor being comprised by the data processing unit, are placed in a repeating pattern in the longitudinal direction of the power supply line.

A tenth aspect of the above described embodiments provides the semiconductor storage device according to the seventh aspect, wherein the data processing unit comprises, corresponding to each of the one bit wide memory cells, a redundancy selection circuit, a data output latch, and a data input latch.

An eleventh aspect of the above described embodiments provides the semiconductor storage device according to the seventh aspect, wherein the peripheral circuit unit comprises a timer unit which is placed next to the data processing unit within the peripheral circuit unit and which generates a pulse for driving the aforementioned peripheral circuit unit, wherein the power supply line of the timer unit is placed equivalently to the placement of the power supply line for the data processing unit.

A twelfth aspect of the above described embodiments provides the semiconductor storage device according to the seventh aspect, wherein the semiconductor storage device is static random access memory (SRAM).

A thirteenth aspect of the above described embodiments provides a semiconductor storage device wherein the power supply line of a first peripheral circuit is orthogonal to the border between a one-bit wide memory cell area and the first peripheral circuit within the packaging area of the memory cell area and the first peripheral circuit placed corresponding to the memory cell area.

A fourteenth aspect of the above described embodiments provides the semiconductor storage device according to the thirteenth aspect, wherein the first peripheral circuit is equipped with a pair of power supply lines so as to correspond to both ends of the memory cell area, in the width direction thereof, corresponding to the present first peripheral circuit.

A fifteenth aspect of the above described embodiments provides the semiconductor storage device according to the thirteenth aspect, wherein the first peripheral circuit comprises a redundancy selection circuit, a data output latch, and a data input latch.

A sixteenth aspect of the above described embodiments provides the semiconductor storage device according to the thirteenth aspect, wherein transistors constituting the first peripheral circuit are formed in a repeating pattern in the longitudinal direction of the power supply line in a position in which the longitudinal direction of the gate pattern of each of the present transistors is orthogonal to the power supply line.

A seventeenth aspect of the above described embodiments provides the semiconductor storage device according to the thirteenth aspect, wherein a power supply line and transistors in a second peripheral circuit next to the first peripheral circuit are placed equivalently to the first peripheral circuit.

An eighteenth aspect of the above described embodiments provides the semiconductor storage device according to the thirteenth aspect, wherein the first peripheral circuit is a data processing unit for processing the data read from, and written to, the memory cell.

The above described embodiment makes it possible to secure the area around which a signal wiring is drawn and to improve the degree of freedom therefor in a semiconductor storage device without being suppressed by a power supply line.

It also makes it possible to secure sufficient power supply strength in a semiconductor storage device.

It also makes it possible to reduce the packaging area in a semiconductor storage device.

It also makes it possible to attain a power supply line of high strength in a semiconductor storage device using a smaller number of man-hours for design.

It also makes it possible to improve the layout efficiency of the peripheral circuit of memory cells in a semiconductor storage device.

It shall be clearly noted that the present invention can be changed in various manners possible within the scope of the present invention in lieu of being limited to the configuration exemplified in the embodiment described above.

What is claimed is:

1. A production method for a semiconductor storage device, comprising:
   placing, next to each other, a memory cell unit arraying a plurality of one-bit memory cells and a peripheral circuit unit including a plurality of one-bit processing circuits, wherein each of the one-bit processing circuits is placed next to a corresponding array of one-bit memory cells, and each of the one-bit circuits reads data from and writes data to the corresponding array of one-bit memory cells;
   placing a pair of power supply lines on each of the r circuits, each power supply line of the pair of power supply lines being placed at a respective edge of the one-bit processing circuit to be orthogonal to a border between each of the one-bit memory cells and the corresponding one-bit processing circuit.

2. The production method for a semiconductor storage device according to claim 1,
   further comprising arraying, in a repeating pattern in the longitudinal direction of the power supply line, circuit structures each placing the gate pattern of a MOS transistor in a direction orthogonal to the power supply line, and
   wherein the one-bit processing circuit comprises the MOS transistor.

3. The production method for a semiconductor storage device according to claim 1, wherein the one-bit processing circuit comprises a redundancy selection circuit, a data output latch, and a data input latch.

4. The production method for a semiconductor storage device according to claim 1, further comprising positioning a power supply line for a timer unit which is placed next to the one-bit processing circuit within the peripheral circuit unit and which generates a pulse for driving the peripheral circuit unit, wherein the present power supply line is placed equivalently to the placement of the power supply line for the one-bit processing circuit.

5. The production method for a semiconductor storage device according to claim 1, wherein the semiconductor storage device is static random access memory.

6. A semiconductor storage device which comprises:
a memory cell unit arraying a plurality of one-bit memory cells;
a peripheral circuit unit including a plurality of one-bit processing circuits, wherein each of the one-bit processinq circuits is placed next to a corresponding array of one-bit memory cells, and each of the one-bit processing circuits reads data from and writes data to the corresponding array of one-bit memory cells; and
a pair of power supply lines is placed on each of the one-bit processing circuits, each power supply line of the pair of power supply lines being placed at a respective edge of the one-bit processing circuit to be orthogonal to a border between each of the memory cells and the corresponding one-bit processing circuit.

7. The semiconductor storage device according to claim 6, wherein circuit structures each placing the gate pattern of a MOS transistor in a direction orthogonal to the power supply line are placed in a repeating pattern in the longitudinal direction of the power supply line, and
wherein the one-bit processing circuit comprises the MOS transistor.

8. The semiconductor storage device according to claim 6, wherein the one-bit processing circuit comprises a redundancy selection circuit, a data output latch, and a data input latch.

9. The semiconductor storage device according to claim 6, wherein the peripheral circuit unit comprises a timer unit which is placed next to the one-bit processing circuit within the peripheral circuit unit and which generates a pulse for driving the aforementioned peripheral circuit unit,
wherein the power supply line of the timer unit is placed equivalently to the placement of the power supply line for the one-bit processing circuit.

10. The semiconductor storage device according to claim 6, wherein the semiconductor storage device is static random access memory.

11. A semiconductor storage device having an array of memory cells including a one-bit memory cell and a first peripheral circuit corresponding to the one-bit memory cell and including a one-bit data processing circuit, comprising:
a pair of power supply lines placed on the one-bit data processing circuit of the first peripheral circuit, each power supply line of the pair of power supply lines being placed at a respective edge of the one-bit data processing circuit to be orthogonal to a border between the one-bit memory cell and the one-bit data processing circuit within a packaging area of the one-bit memory cell and the first peripheral circuit placed corresponding to the one-bit memory cell, the one-bit data processing circuit reading data from and writing data to the one-bit memory cell.

12. The semiconductor storage device according to claim 11, wherein the first peripheral circuit comprises a redundancy selection circuit, a data output latch, and a data input latch.

13. The semiconductor storage device according to claim 11, wherein transistors constituting the first peripheral circuit are formed in a repeating pattern in the longitudinal direction of the power supply line in a position in which the longitudinal direction of the gate pattern of each of the present transistors is orthogonal to the power supply line.

14. The semiconductor storage device according to claim 11, wherein a power supply line and transistors in a second peripheral circuit next to the first peripheral circuit are placed equivalently to the first peripheral circuit.

* * * * *